United States Patent
Pak et al.

(10) Patent No.: US 9,035,865 B2
(45) Date of Patent: May 19, 2015

(54) GATE DRIVING CIRCUIT AND DISPLAY APPARATUS USING THE SAME

(75) Inventors: Sang-Jin Pak, Yongin (KR); Joo-Hyung Lee, Yongin (KR); Yun-Ho Choi, Yongin (KR); Jin-Woo Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 1104 days.

(21) Appl. No.: 13/046,573

(22) Filed: Mar. 11, 2011

(65) Prior Publication Data

US 2011/0221736 A1    Sep. 15, 2011

(30) Foreign Application Priority Data

Mar. 11, 2010    (KR) .................. 10-2010-0021833

(51) Int. Cl.
G09G 3/36    (2006.01)

(52) U.S. Cl.
CPC .................. *G09G 3/3677* (2013.01)

(58) Field of Classification Search
CPC .................. G09G 3/3688; G11C 19/28
USPC ..................... 345/100; 377/64–81
See application file for complete search history.

(56) References Cited

U.S. PATENT DOCUMENTS

| | | | |
|---|---|---|---|
| 5,434,899 A | 7/1995 | Huq et al. | |
| 7,289,593 B2 * | 10/2007 | Tobita et al. | 377/64 |
| 7,548,228 B2 * | 6/2009 | Pak et al. | 345/100 |
| 2006/0145991 A1 | 7/2006 | Jang et al. | |
| 2007/0040792 A1 | 2/2007 | Kwag et al. | |
| 2007/0247932 A1 * | 10/2007 | Tobita | 365/189.12 |
| 2008/0012818 A1 * | 1/2008 | Lee et al. | 345/100 |
| 2008/0079701 A1 | 4/2008 | Shin et al. | |
| 2008/0187089 A1 | 8/2008 | Miyayama et al. | |
| 2009/0086116 A1 | 4/2009 | Pak | |

FOREIGN PATENT DOCUMENTS

| | | |
|---|---|---|
| JP | 2006-189767 A | 7/2006 |
| JP | 2008-193545 A | 8/2008 |
| KR | 10-2006-0134615 A | 12/2006 |
| KR | 10-2007-0079489 A | 8/2007 |
| KR | 10-2008-0030212 A | 4/2008 |
| KR | 10-2009-0032712 A | 4/2009 |

* cited by examiner

*Primary Examiner* — Amr Awad
*Assistant Examiner* — Aaron Midkiff
(74) *Attorney, Agent, or Firm* — Knobbe, Martens, Olson & Bear, LLP

(57) ABSTRACT

A gate driving circuit for driving a display apparatus is disclosed. The gate driving circuit properly generates gate voltages despite inconsistent transistor characteristics due to processing and environment by maintaining certain nodes in reliably high impedance states.

20 Claims, 13 Drawing Sheets

COMPARATIVE EXAMPLE

EMBODIMENT OF PRESENT INVENTION

GATE DRIVING CIRCUIT AND DISPLAY APPARATUS USING THE SAME

CROSS-REFERENCE TO RELATED APPLICATIONS

This application claims the benefit of Korean Patent Application No. 10-2010-0021833, filed on Mar. 11, 2010, in the Korean Intellectual Property Office, the disclosure of which is incorporated herein in its entirety by reference.

BACKGROUND

1. Field

The disclosed technology relates to a gate driving circuit and a display apparatus using the same.

2. Description of the Related Technology

In a display apparatus, a data driving unit converts input data into a data signal, a gate driving unit generates scan signals for the pixels so as to adjust luminance of each pixel according to the data signal, and thus an image corresponding to the input data is displayed. The data driving unit and the gate driving unit may operate according to timing determined by control signals of a timing control unit.

Each pixel of a liquid crystal display (LCD) apparatus includes a liquid crystal capacitor that is coupled to a gate line and is charged to an image data voltage, and a storage capacitor that is coupled to the liquid crystal capacitor and maintains the voltage charged in the liquid crystal capacitor. An image is displayed according to the voltage charged in the liquid crystal capacitor.

SUMMARY OF CERTAIN INVENTIVE ASPECTS

One inventive aspect is a gate driving circuit for driving a display apparatus. The gate driving circuit includes a plurality of stages, where each stage includes first, second, and third nodes, where the third node is coupled to the first node via at least one transistor. Each stage also includes an input circuit unit configured to provide a driving voltage to the first node in response to an output signal of a previous stage or to a start pulse, a driving circuit unit including the second node and configured to generate an output signal according to a voltage of the first node, and a leakage preventing circuit unit configured to prevent a leakage current from the first node by maintaining the third node in a high impedance (high-Z) state when the first node is in a high-Z state.

Another inventive aspect is a display apparatus. The display apparatus includes a plurality of pixels disposed near intersections of data lines and gate lines, a gate driving unit for outputting gate driving signals to the plurality of pixels via the gate lines, and a data driving unit for generating a data signal corresponding to an input image and outputting the data signal to the plurality of pixels via the data lines. The gate driving unit includes a plurality of stages, where each stage includes first, second, and third nodes, where the third node is coupled to the first node via at least one transistor. Each stage also includes an input circuit unit configured to provide a driving voltage to the first node in response to an output signal of a previous stage or to a start pulse, a driving circuit unit including the second node and configured to generate an output signal according to a voltage of the first node, and a leakage preventing circuit unit configured to prevent a leakage current from the first node by maintaining the third node in a high impedance (high-Z) state when the first node is in a high-Z state.

BRIEF DESCRIPTION OF THE DRAWINGS

These and/or other aspects will become apparent and more readily appreciated from the following description of various embodiments, taken in conjunction with the accompanying drawings of which.

DETAILED DESCRIPTION OF CERTAIN INVENTIVE EMBODIMENTS

Figure 1:
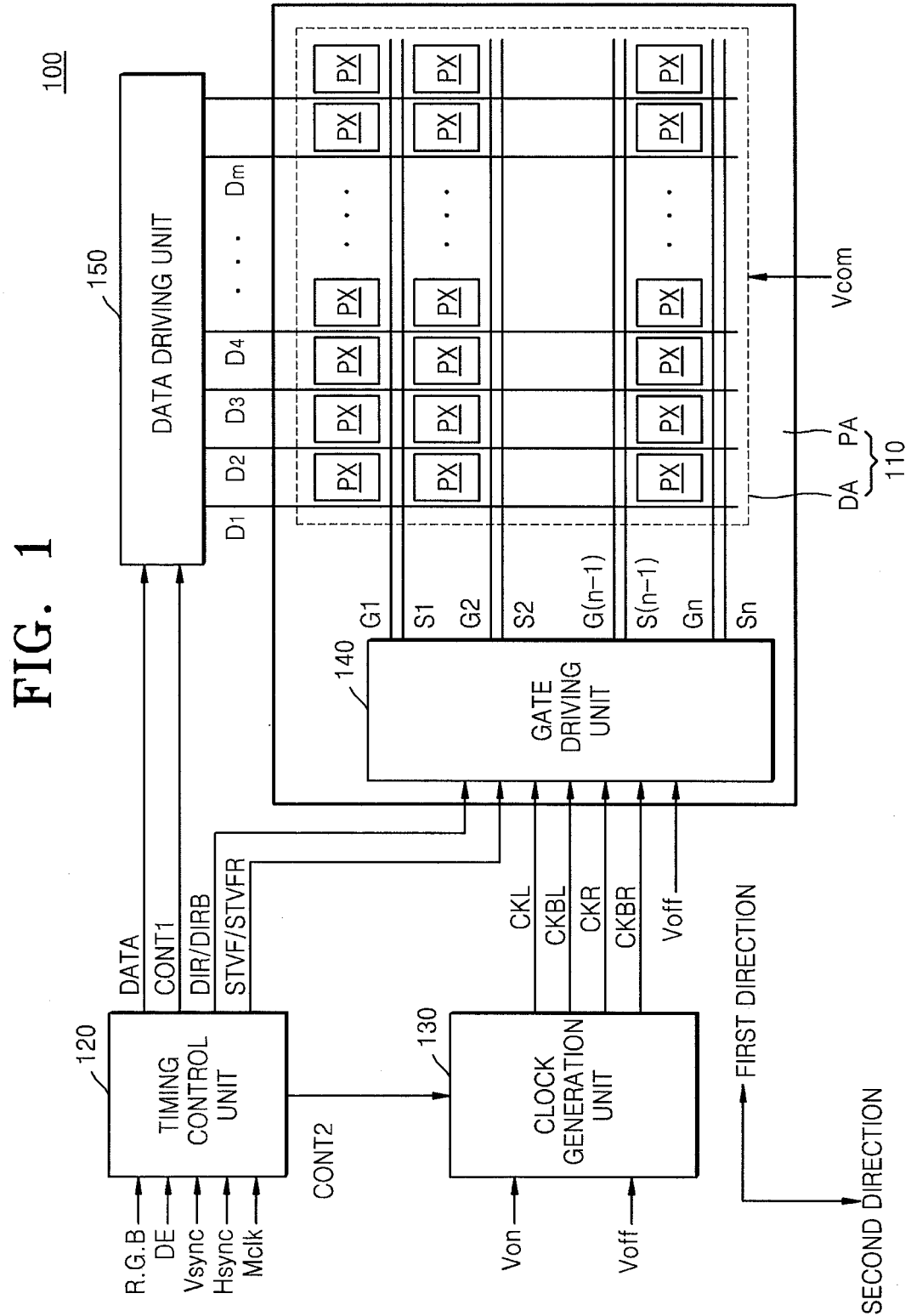
FIG. 1 is a block diagram of a display apparatus according to an embodiment.

Detailed illustrative exemplary embodiments are disclosed herein. However, certain specific structural and functional details disclosed herein are merely representative for purposes of describing exemplary embodiments. Other embodiments may, however, take on many alternate forms and should not be construed as limited to the embodiments set forth herein. Accordingly, while various modifications and alternative forms may be implemented, specific embodiments are shown by way of example in the drawings and will herein be described in detail. It should be understood, however, that there is no intent to limit practical embodiments to the particular forms disclosed, but conversely, practical embodiments are understood to cover all modifications, equivalents, and alternatives falling within the spirit and scope of the disclosed embodiments.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Like reference numerals generally refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of exemplary embodiments.

The terminology used herein is for the purpose of describing particular embodiments only and is not intended to be limiting of exemplary embodiments of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated components, steps, operations and/or elements, but do not preclude the presence or addition of one or more other components, steps, operations and/or elements.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
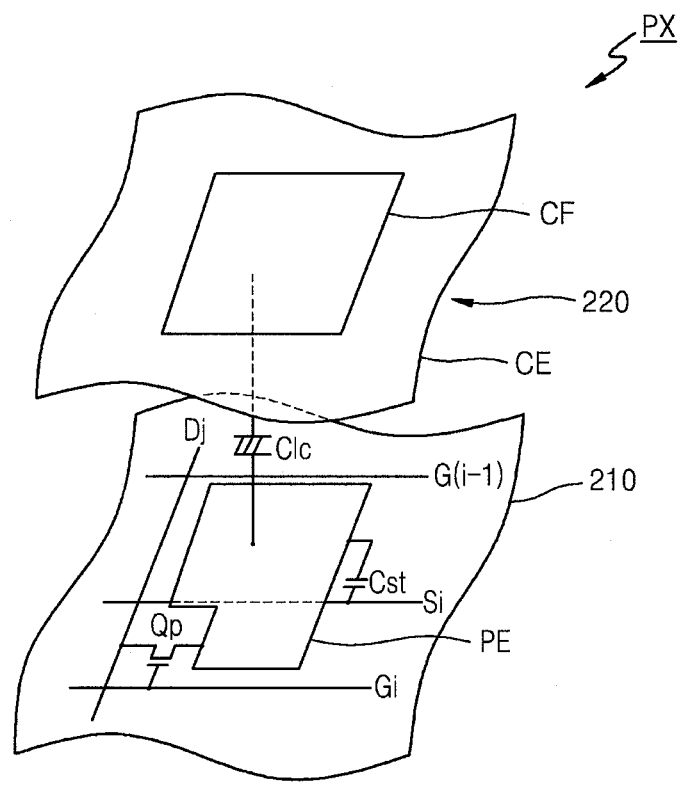
FIG. 2 is a schematic diagram of a pixel illustrated in FIG. 1, according to an embodiment.

FIG. 1 is a block diagram of a display apparatus 100 according to an embodiment. FIG. 2 is a schematic diagram of a pixel P illustrated in FIG. 1, according to an embodiment. The display apparatus 100 may be one of various display apparatuses such as a liquid crystal display (LCD) apparatus, an organic electro-luminescent display apparatus, a plasma display panel or a field emission display apparatus. Hereinafter, the display apparatus 100 is discussed as an LCD apparatus. However, the display apparatus 100 is not limited to an LCD apparatus and may also be another kind of display apparatus.

The display apparatus 100 includes a liquid crystal panel 110, a timing control unit 120, a clock generation unit 130, a gate driving unit 140, a data driving unit 150 and pixels PX.

The liquid crystal panel 110 may be divided into a display area DA in which an image is displayed and a peripheral area PA in which an image is not displayed.

As shown in FIGS. 1 and 2, the display area DA includes a first substrate 210 on which first through nth gate lines G1 through Gn, first through nth storage lines S1 through Sn, first through mth data lines D1 through Dm, a pixel switching device Qp and a pixel electrode PE are formed. The display area DA also includes a second substrate 220 on which a color filter CF and a common electrode CE are formed. In addition, a liquid crystal layer (not shown) is interposed between the first and second substrates 210 and 220. The first through nth gate lines G1 through Gn extend in a first direction in parallel to each other, and the first through nth storage lines S1 through Sn extend in the first direction to respectively correspond to the first through nth gate lines G1 through Gn. The first through mth data lines D1 through Dm extend in a second direction in parallel to each other. Alternatively, the first through nth gate lines G1 through Gn and the first through nth storage lines S1 through Sn may extend in the second direction, and the first through mth data lines D1 through Dm may extend in the first direction.

As illustrated in FIG. 2, one pixel PX connected to an ith gate line Gi (i is a natural number, $1 \leq i \leq n$) and a jth data line Dj (j is a natural number, $1 \leq j \leq m$) includes the pixel switching device Qp including a gate electrode connected to the ith gate line Gi, a first electrode connected to the jth data line Dj, and a second electrode connected to the pixel electrode PE, and a liquid crystal capacitor Clc and storage capacitor Cst that are coupled to the second electrode of the pixel switching device Qp via the pixel electrode PE.

The liquid crystal capacitor Clc is formed by using the pixel electrode PE of the first substrate 210 and the common electrode CE of the second substrate 220, and includes the liquid crystal layer between the pixel electrode PE and the common electrode CE as a dielectric. A common voltage Vcom is applied to the common electrode CE. The light transmittance of the liquid crystal layer is controlled with a voltage applied to the pixel electrode PE, and thus the luminance of the pixel PX is controlled.

The pixel electrode PE may be coupled to the jth data line Dj via the pixel switching device Qp. Because the gate electrode of the pixel switching device Qp is connected to the ith gate line Gi, when a gate on voltage Von is applied to the ith gate line Gi, the pixel switching device Qp applies a data signal transmitted via the jth data line Dj, to the pixel electrode PE.

The storage capacitor Cst includes one terminal coupled to the liquid crystal capacitor Clc and another terminal coupled to an ith storage line Si.

The color filter CF may, for example, be formed in a partial region of the common electrode CE of the second substrate 220. Here, the pixel switching device Qp may be an amorphous silicon (a-Si) thin film transistor (TFT).

The peripheral area PA is an area in which an image is not displayed. The first substrate 210 may be larger than the second substrate 220 so as to include the peripheral area PA. The extent of the second substrate 220 may correspond to the display area DA. As illustrated in FIG. 1, the gate driving unit 140 may be formed on a region of the first substrate 210, which corresponds to the peripheral area PA.

The timing control unit 120 receives input image signals R, G and B and an input control signal for controlling display of the input image signals R, G and B, from a graphic controller (not shown), and generates and provides an image data signal DATA and a data driving unit control signal CONT1 to the data driving unit 150. The timing control unit 120 receives input control signals such as a horizontal synchronization signal Hsync, a main clock signal Mclk and a data enable signal DE, and outputs the data driving unit control signal CONT1. Here, the data driving unit control signal CONT1 is a signal for controlling operation of the data driving unit 150, and includes a horizontal start signal for starting operation of the data driving unit 150 and a load signal for indicating an output of a data voltage.

The data driving unit 150 receives the image data signal DATA and the data driving unit control signal CONT1 and provides a data signal corresponding to the image data signal DATA to each of the first through mth data lines D1 through Dm. The data driving unit 150 may be an integrated circuit (IC) and may be connected to the liquid crystal panel 110 as a tape carrier package (TCP) or may be formed on the peripheral area PA of the liquid crystal panel 110.

The timing control unit 120 may provide a clock generation control signal CONT2 to the clock generation unit 130, and first and second start pulses STVF and STVFR and first and second scan direction control signals DIR and DIRB to the gate driving unit 140. The clock generation control signal CONT2 may include a gate clock signal for determining timing of when the gate on voltage Von is output, an output enable signal for determining a pulse width of the gate on voltage Von, and the like. The first and second scan direction control signals DIR and DIRB may control the sequencing order of periods when the gate on voltage Von is applied to the first through nth gate lines G1 through Gn, i.e.,- on periods. For example, if the first scan direction control signal DIR is at a high level and the second scan direction control signal DIRB is at a low level, a- on period may be initially provided to the first gate line G1 and then sequentially provided to the second through nth gate lines G2 through Gn. This operation mode is referred to as forward scan mode. Alternatively, if the first scan direction control signal DIR is at a low level and the second scan direction control signal DIRB is at a high level, a- on period is initially provided to the nth gate line Gn and then is sequentially provided to the (n−1)th through first gate lines Gn−1 through G1. This operation mode is referred to as backward scan mode.

The clock generation unit 130 may output a first clock signal CKL, a first inversion clock signal CKBL, a second clock signal CKR and a second inversion clock signal CKBR by using the clock generation control signal CONT2. The first inversion clock signal CKBL may be an inversion signal or a ½ cycle delayed signal of the first clock signal CKL. The second inversion clock signal CKBR may be an inversion signal or a ½ cycle delayed signal of the second clock signal CKR. The cycle of the first and second clock signals CKL and CKR may be a 4 horizontal (H) cycle, and the second clock signal CKR may be delayed from the first clock signal CKL by a 1H cycle.

The gate driving unit 140 provides gate signals to the first through nth gate lines G1 through Gn by using the first and second start pulses STVF and STVFR, the first and second scan direction control signals DIR and DIRB, the first and second clock signal CKL and CKR, the first and second inversion clock signals CKBL and CKBR, and the gate off voltage Voff.

The above-described structure of the display apparatus 100 is provided as an example. The display apparatus 100 may have various structures and is not limited to the structure illustrated in FIGS. 1 and 2. For example, the detailed structure of the pixels PX may have any of a variety of a variety of structures. Also, according to some embodiments, the types of signals input and output to and from the timing control unit 120, the clock generation unit 130, the gate driving unit 140 and the data driving unit 150 are different.

Figure 3:
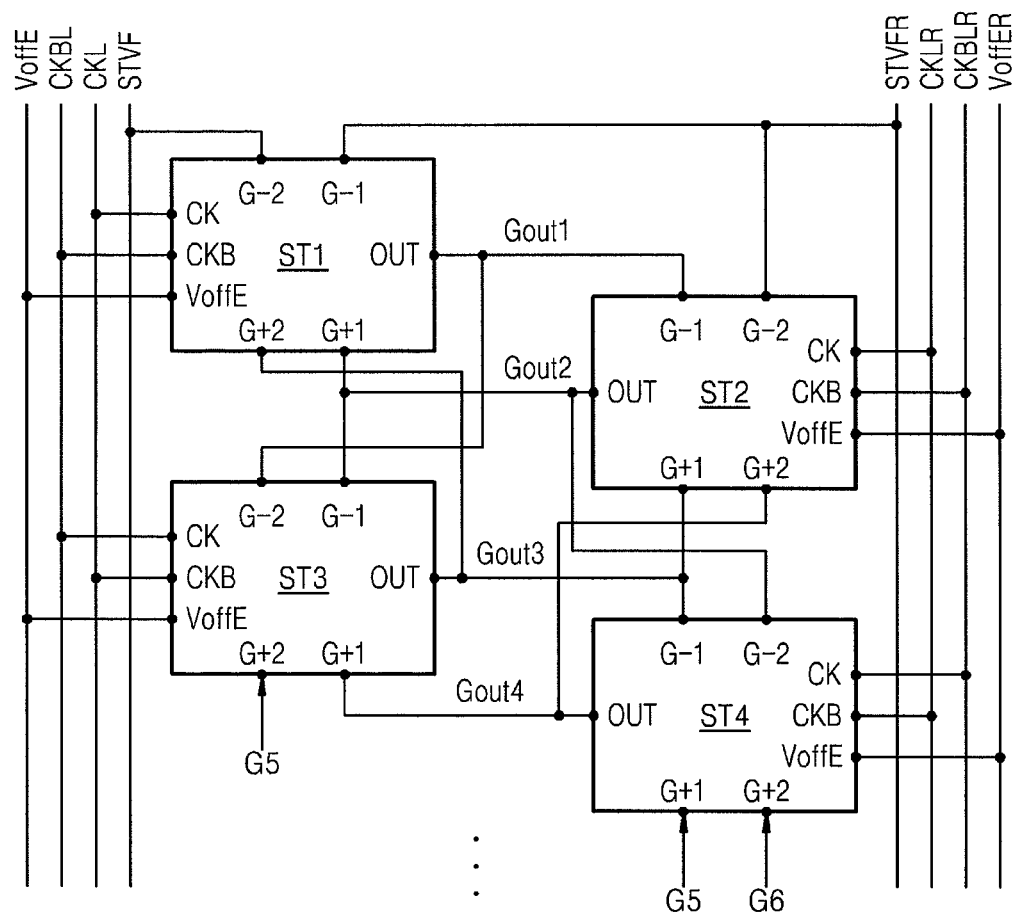
FIG. 3 is a schematic diagram of a gate driving circuit illustrated in FIG. 1, according to an embodiment.

FIG. 3 is a schematic diagram of the gate driving circuit 140 illustrated in FIG. 1, according to an embodiment.

The gate driving unit 140 includes at least one gate driving IC and each gate driving IC includes a gate driving circuit. The gate driving circuit may be formed as a shift register including first through nth stages ST1 through STn. The number of stages may be selected by a designer. As illustrated in FIG. 3, the first through nth stages ST1 through STn receive the first and second start pulses STVF and STVFR. Each stage STi includes a first input terminal G−2, a second input terminal G−1, a clock terminal CK, an inversion clock terminal CKB, an off voltage terminal VoffE, a third input terminal G+1, a fourth input terminal G+2 and an output terminal OUT.

The first input terminal G−2 is connected to the output terminal OUT of a stage immediately before the previous stage, and the second input terminal G−1 is connected to the output terminal OUT of the previous stage. The third input terminal G+1 is connected to the output terminal OUT of the next stage, and the fourth input terminal G+2 is connected to the output terminal OUT of a stage immediately after the next stage. The off voltage terminal VoffE is connected to a line of the gate off voltage Voff.

When the first and second clock signals CKL and CKR and the first and second inversion clock signals CKBL and CKBR are used, a different clock signal and a different inversion clock signal are input according to the position of a stage. For example, as illustrated in FIG. 3, odd-number stages such as the first and third stages ST1 and ST3 may receive the first clock signal CKL and the first inversion clock signal CKBL, and even-number stages such as the second and fourth stages ST2 and ST4 may receive the second clock signal CKR and the second inversion clock signal CKBR.

Also, in (4a+1)th stages (a is an integer, 0≤a<n/4), the first clock signal CKL may be input to the clock terminal CK and the first inversion clock signal CKBL may be input to the inversion clock terminal CKB. In (4a+3)th stages, the first inversion clock signal CKBL may be input to the clock terminal CK and the first clock signal CKL may be input to the inversion clock terminal CKB. In (4a+2)th stages, the second clock signal CKR may be input to the clock terminal CK and the second inversion clock signal CKBR may be input to the inversion clock terminal CKB. In (4a+4)th stages, the second inversion clock signal CKBR may be input to the clock terminal CK and the second clock signal CKR may be input to the inversion clock terminal CKB.

Figure 5:
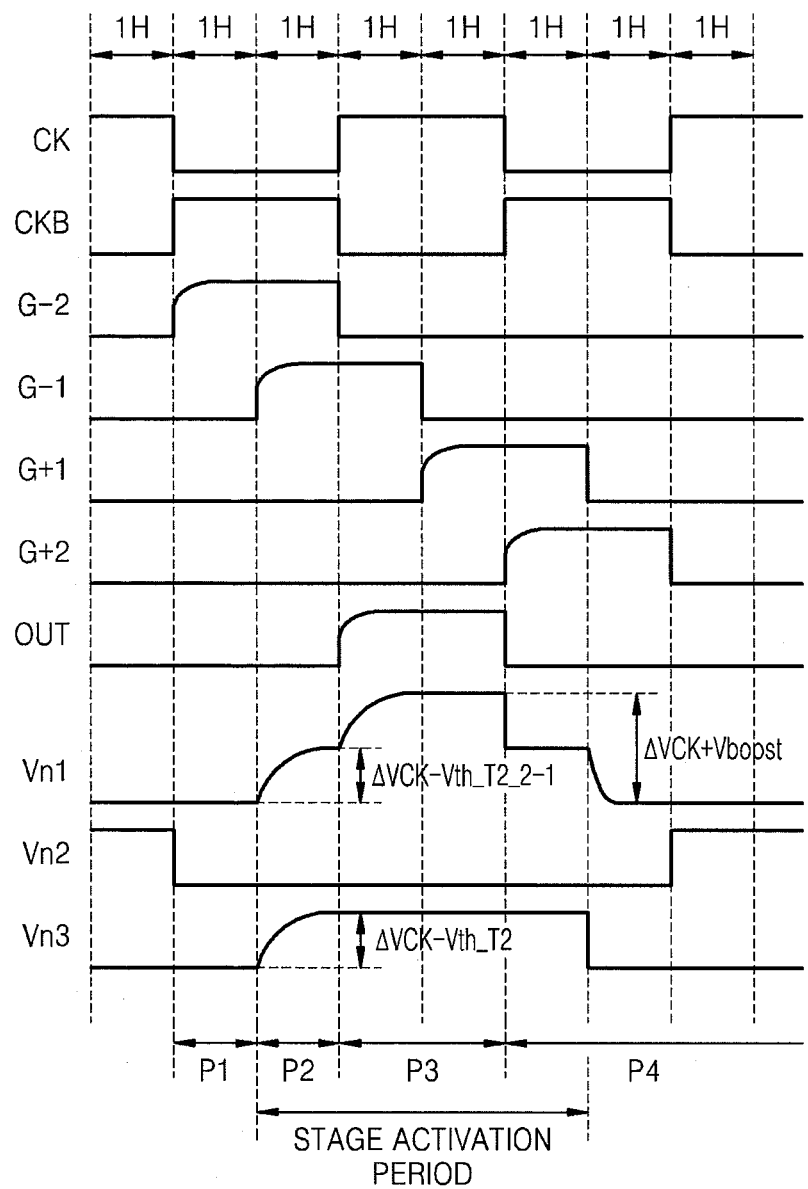
FIG. 5 is a timing diagram showing operation of the gate driving circuit illustrated in FIG. 4, according to an embodiment.

The first start pulse STVF is input to the first input terminal G−2 of the first stage ST1 and the second start pulse STVFR is input to the second input terminal G−1 of the first stage ST1. The second start pulse STVFR is also input to the first input terminal G−2 of the second stage ST2 and the second input terminal G−1 of the second stage ST2 is connected to the output terminal OUT of the first stage ST1. The first and second start pulses STVF and STVFR may have a- on period of about a 2H cycle, as shown in FIG. 5, and the second start pulse STVFR may be delayed from the first start pulse STVF by a 1H cycle.

First through nth output signals Gout1 through Goutn output from the output terminals OUT of the first through nth stages ST1 through STn may be gate signals to be output to the pixels PX, and may be output to the pixels PX via the first through nth gate lines G1 through Gn. Alternatively, the first through nth output signals Gout1 through Goutn may be storage voltages to be output to the pixels PX, and may be output to the pixels PX via the first through nth storage lines S1 through Sn.

Figure 4:
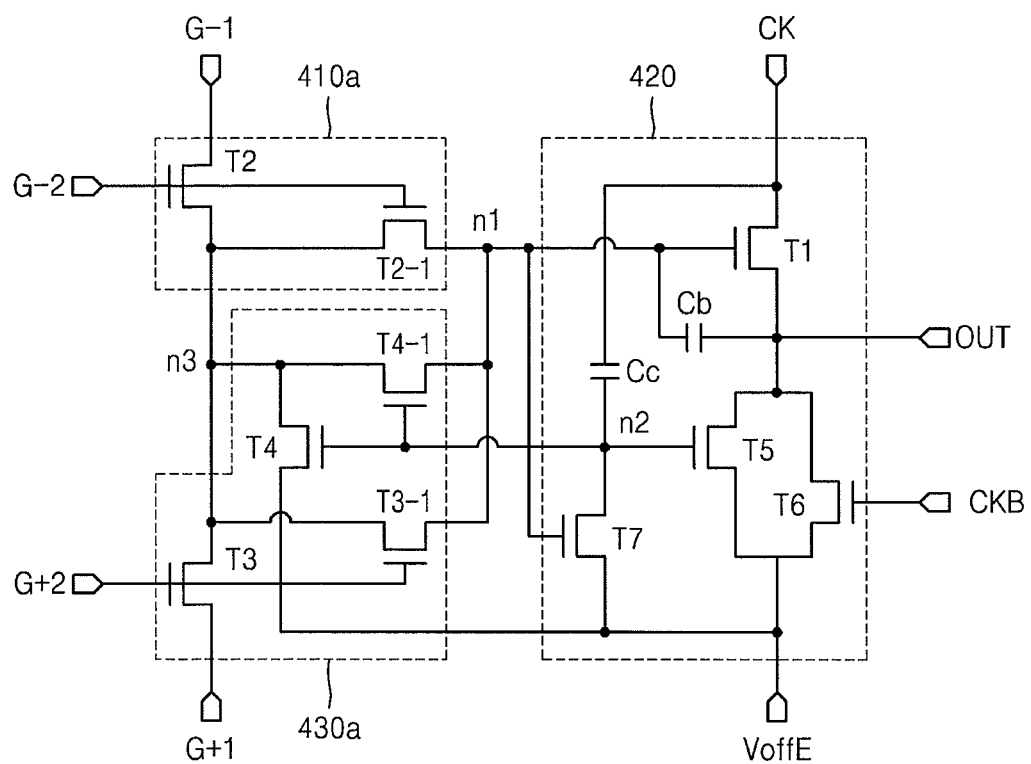
FIG. 4 is a circuit diagram of an arbitrary stage of the gate driving circuit illustrated in FIG. 3, according to an embodiment.

FIG. 4 is a circuit diagram of an arbitrary stage of the gate driving circuit 140 illustrated in FIG. 3, according to an embodiment.

The arbitrary stage of the gate driving circuit 140 includes first through third nodes n1 through n3, an input circuit unit 410a for receiving an output signal of a previous stage and outputting the output signal to the first node n1, a driving circuit unit 420 for generating an ith output signal Gouti according to a voltage of the first node n1, and a leakage preventing circuit unit 430a for preventing a leakage current by maintaining the third node n3 in a high impedance (high-Z) state at greater than a minimum voltage level when the first node n1 is in a high-Z state. A high-Z state refers to a state when all transistors having a drain or source electrode connected to a certain node are substantially turned off. In some embodiments, a high-Z state includes a condition where there is substantially no conductive path to a low impedance node such as a power source.

The third node n3 enters a high-Z state at the same time as the first node n1.

The gate stage of FIG. 4 may be formed by using n-type transistors, p-type transistors, complementary metal oxide semiconductor (CMOS) transistors, or a combination thereof. As shown, the stage of FIG. 4 is formed with n-type transistors. However, the gate driving circuit 140 is not limited to n-type transistors.

The input circuit unit 410a includes the second transistor T2 and a (2-1)th transistor T2-1. The second transistor T2 includes a gate electrode connected to a first input terminal G-2, a first electrode connected to a second input terminal G-1, and a second electrode connected to the third node n3. The (2-1)th transistor T2-1 includes a gate electrode connected to the first input terminal G-2, a first electrode connected to the third node n3, and a second electrode connected to the first node n1.

The driving circuit unit 420 includes the first transistor T1, fifth through seventh transistors T5 through T7, a boosting capacitor Cb and a coupling capacitor Cc. The first transistor T1 includes a gate electrode connected to the first node n1, a first electrode connected to the clock terminal CK, and a second electrode connected to the output terminal OUT. The boosting capacitor Cb is connected between the first node n1 and the output terminal OUT. The fifth transistor T5 includes a gate electrode connected to the second node n2, a first electrode connected to the output terminal OUT, and a second electrode connected to the off voltage terminal VoffE. The sixth transistor T6 includes a gate electrode connected to the inversion clock terminal CKB, a first electrode connected to the output terminal OUT, and a second electrode connected to the off voltage terminal VoffE. The seventh transistor T7 includes a gate electrode connected to the first node n1, a first electrode connected to the second node n2, and a second electrode connected to the off voltage terminal VoffE. The coupling capacitor Cc is connected between the clock terminal CK and the second node n2.

The first transistor T1 selectively connects the clock terminal CK to the output terminal OUT according to the voltage of the first node n1. The boosting capacitor Cb holds a minimum voltage difference between the gate electrode and the second electrode of the first transistor T1 so that the output signal has sufficient amplitude.

The leakage preventing circuit unit 430a includes the third transistor T3, a (3-1)th transistor T3-1, the fourth transistor T4 and a (4-1)th transistor T4-1. The third transistor T3 includes a gate electrode connected to a fourth input terminal G+2, a first electrode connected to the third node n3, and a second electrode connected to a third input terminal G+1. The (3-1)th transistor T3-1 includes a gate electrode connected to the fourth input terminal G+2, a first electrode connected to the third node n3, and a second electrode connected to the first node n1. The fourth transistor T4 includes a gate electrode connected to the second node n2, a first electrode connected to the third node n3, and a second electrode connected to the off voltage terminal VoffE. The (4-1)th transistor T4-1 includes a gate electrode connected to the second node n2, a first electrode connected to the third node n3, and a second electrode connected to the first node n1.

FIG. 5 is a timing diagram showing operation of the stage of the gate driving circuit 140 illustrated in FIG. 4, according to an embodiment. FIG. 5 shows voltage levels of every terminal and node of the stage. Vn1 through Vn3 respectively represent voltages of first through third nodes n1 through n3.

During a period P1, the second node n2 is coupled to the clock terminal CK via the coupling capacitor Cc and changes to the gate off voltage Voff with the change of the clock terminal CK. Also during the period P1, the second and (2-1) th transistors T2 and T2-1 are turned on by the gate on voltage Von at the first input terminal G-2 and thus the gate off voltage Voff at the second input terminal G-1 is applied to the first and third nodes n1 and n3. Because the sixth transistor T6 is turned on by the gate on voltage Von of the inversion clock terminal CKB, the gate off voltage Voff of the off voltage terminal VoffE is applied to the output terminal OUT.

During a period P2, the first node n1 is precharged. Because the second and (2-1)th transistors T2 and T2-1 are maintained in-an on state and the second input terminal G-1 changes to the gate on voltage Von, the gate on voltage Von is applied to the first and third nodes n1 and n3. The first node n1 is precharged to a voltage level ($\Delta$VCK-Vth_T2-Vth_2-1) obtained by subtracting threshold voltages (Vth_T2 and VthT_2-1) of the second and (2-1)th transistors T2 and T2-1, respectively, from the voltage of a first or second clock signal. A voltage level of the first node n1 does not instantly increase, but gradually increases because of the capacitance at the first node n1 and the resistance on the path between the first node n1 and the second input terminal G-1. The third node n3 is charged to a voltage level ($\Delta$VCK-Vth_T2) obtained by subtracting a threshold voltage (Vth_T2) of the second transistor T2 from the voltage of the first or second clock signal. The second node n2 is maintained in the level of the gate off voltage Voff. The output terminal OUT is maintained at the level of the gate off voltage Voff as the sixth transistor T6 is maintained in -an on state.

The third, (3-1)th, fourth and (4-1)th transistors T3, T3-1, T4 and T4-1 are maintained in an- off state during the periods P1 and P2.

During a period P3, because the first input terminal G-2 changes to the gate off voltage Voff, the second and (2-1)th transistors T2 and T2-1 are turned off. Because the seventh transistor T7 is turned on by the voltage at the first node n1, the second node n2 is maintained in the gate off voltage Voff. Because the second node n2 has the gate off voltage Voff, the fourth and (4-1)th transistors T4 and T4-1 are maintained in -the off state. Because the fourth input terminal G+2 has the gate off voltage Voff, the third and (3-1)th transistors T3 and T3-1 are maintained in -the off state. Because the second, (2-1)th, third, (3-1)th, fourth and (4-1)th transistors T2, T2-1, T3, T3-1, T4 and T4-1 are -in the off state, the third node n3 is in a floating state and the voltage at the third node n3 is maintained at the voltage level of the period P2, i.e., $\Delta$VCK-Vth_T2. The first transistor T1 is on because of the voltage at the first node n1, and the gate on voltage Von of the clock terminal CK is applied to the output terminal OUT. Because the clock terminal CK goes to a high voltage, the output terminal OUT rises, and the first node n1 is boosted to a voltage ($\Delta$VCK+Vboost) by the boosting capacitor Cb due to the rising voltage of the output terminal OUT. As a result, the gate-to-source voltage Vgs of the first transistor T1 is maintained such that the first transistor T1 operates in the saturation region. Here, Vboost represents a voltage coupled by the boosting capacitor Cb, and may be determined as represented in Equation 1.

$$V\text{boost} = (Cb/(Cb + \text{Capacitance at First Node})) \times \Delta V\text{OUT} \quad \Delta V\text{OUT represents the voltage change at the output terminal OUT.} \quad [\text{Equation 1}]$$

As the voltage of the first node n1 is boosted by the boosting capacitor Cb, the voltage of the output terminal OUT may change to the full value of the voltage of the clock terminal CK. In this case, the first node n1 has to be maintained in a high-Z state in order to maintain the voltage of the first node n1 in the boosted state. In some embodiments, a voltage drop at the first node n1 caused by a leakage current is prevented. According to some embodiments, the third node n3 is maintained at the voltage level (ΔVCK−Vth_T2) during the period P3. As a result, the gate-to-source voltage Vgs of the (2−1)th, (3−1)th and (4−1)th transistors T2−1, T3−1 and T4−1 is dropped to a negative value. Accordingly, leakage current of the (2−1)th, (3−1)th and (4−1)th transistors T2−1, T3−1 and T4−1 in the period P3 is greatly reduced. The reduction in leakage current of some embodiments will now be described in more detail with reference to FIGS. 6 through 8.

Figure 6:
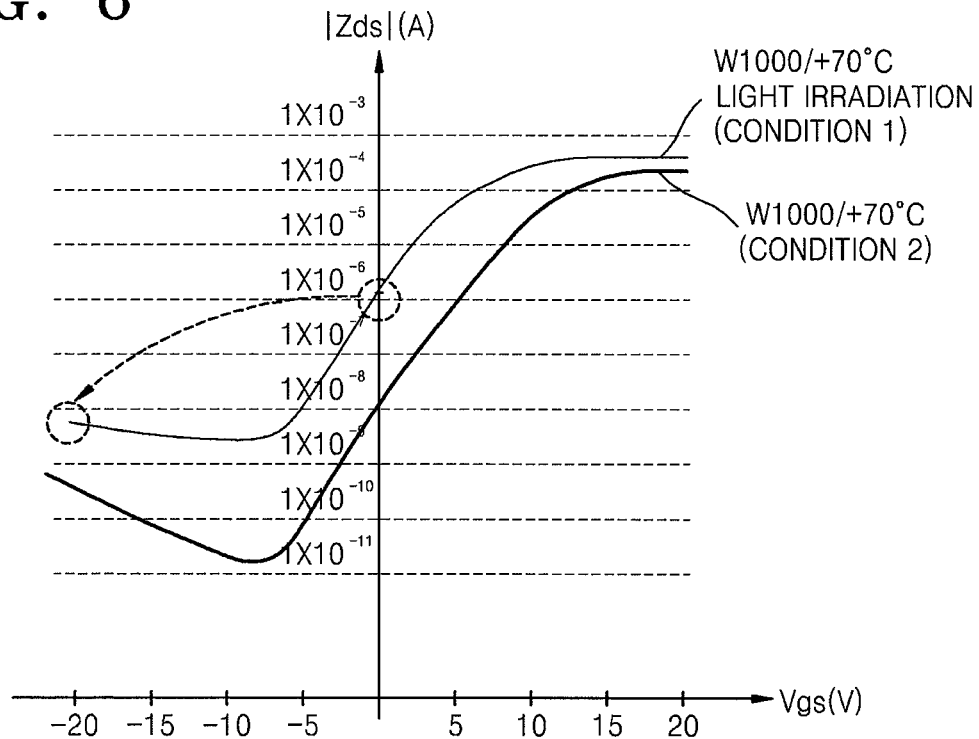
FIG. 6 is a graph showing current-voltage characteristics of a transistor formed on an amorphous silicon (a-Si) thin film transistor (TFT)

FIG. 6 is a graph showing current-voltage characteristics of a transistor formed on an amorphous silicon (a-Si) TFT.

The gate driving circuit 140 illustrated in FIGS. 1 through 4 may be formed on an a-Si TFT. The a-Si TFT has large characteristic deviations between transistors included in a circuit according to process and usage environment. In particular, a gate block defect (GBD) may occur at high temperatures and a leakage current may occur in the off state as a characteristic dispersion exists between lots. If light is irradiated from a backlight unit at a high temperature, the leakage current is increased. As such, the gate driving circuit 140 formed on the a-Si TFT has a leakage current even if Vgs=0V. Accordingly, the nodes of the driving circuit 140, which are intended to be in a high-Z state may not be in the high-Z state if the transistors which are intended to be in the off state have significant leakage current. As a result, the voltage at the first, second, and third nodes n1, n2, and n3 is changed from that which is intended.

This type of error may not occur immediately after fabrication, but may be detected after a period of high temperature operation (e.g. within 10 hours after being inserted into a chamber). A fabrication (FAB) process may be used to control initial current-voltage characteristics of a transistor. However, the processes used are costly and may adversely affect yield.

FIG. 6 shows current-voltage characteristics of a transistor formed on an a-Si TFT with a characteristic dispersion of transistor characteristics between lots. The transistor has a channel width W of 1000 nm. In addition, for condition 1, light is irradiated at a high temperature, i.e., at 70° C. and for condition 2, light is not irradiated. FIG. 6 shows that a leakage current when Vgs=0V is increased when light is irradiated in comparison to when light is not irradiated. For the circuit of FIG. 4, as the voltage of the third node n3 is maintained at a voltage level (ΔVCK−Vth_T2) during a stage activation period such that the gate-to-source voltage Vgs of the (2−1)th, (3−1)th and (4−1)th transistors T2−1, T3−1 and T4−1 has a negative value, the leakage current through these transistors is greatly reduced. For example, if the gate off voltage Voff is −10V, the gate on voltage Von is 15V, and the threshold voltage (Vth_T2) of the second transistor T2 is 3V, the gate-to-source voltage Vgs of the (2−1)th transistor T2−1 is Vgs=Voff−(Von−Vth_T2)=−10V−(15V−3V)=−22V. As illustrated in FIG. 6,—when light is irradiated, leakage current is reduced by two orders of magnitude in comparison to a case when Vgs=0V. Likewise, the gate-to-source voltage Vgs of the (3−1)th and (4−1)th transistors T3−1 and T4−1 is also reduced and thus a leakage current is likewise reduced in these transistors. As a result, the first node n1 has the intended voltage while in the high-Z state despite transistor characteristic dispersion and environmental variation, and proper gate driving is performed.

Figure 7:
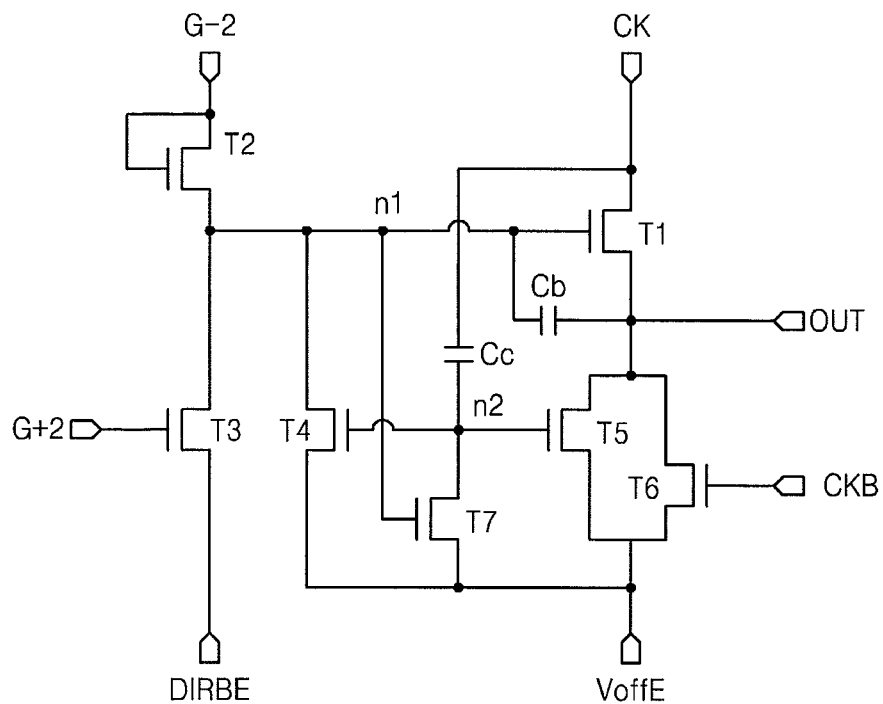
FIG. 7 is a circuit diagram of an arbitrary stage of a gate driving circuit not including (2–1)th, (3–1)th and (4–1)th transistors illustrated in FIG. 4, according to a comparative example.
Figure 8:
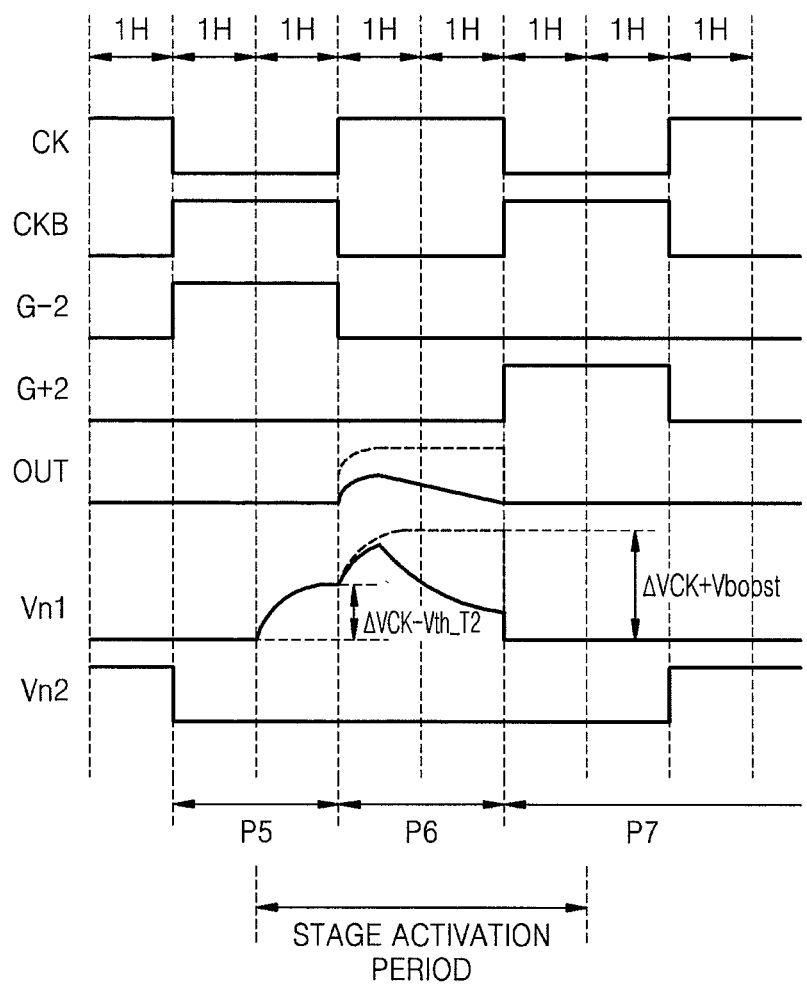
FIG. 8 is a timing diagram showing operation of the gate driving circuit illustrated in FIG. 7, according to a comparative example.

A circuit which is adversely affected by leakage current is shown in FIG. 7. The circuit of FIG. 7 does not include the (2−1)th, (3−1)th and (4−1)th transistors T2−1, T3−1 and T4−1 illustrated in FIG. 4. FIG. 8 is a timing diagram showing operation of the gate driving circuit illustrated in FIG. 7.

As illustrated in FIG. 7, the (2−1)th, (3−1)th and (4−1)th transistors T2−1, T3−1 and T4−1 do not exist and the third node n3 is not included. Accordingly, when the first node n1 is intended to be in the high-Z state in a period P6, leakage current occurs in the second, third and fourth transistors T2, T3 and T4, and thus the voltage Vn1 at the first node n1 in period P6 is not properly held to the intended voltage -represented by the dashed line, but instead drops as represented by the solid line. As the voltage Vn1 of the first node n1 drops due to leakage current, the voltage of the output terminal OUT in the period P6 is not properly held to the intended voltage represented by the dashed line, but instead drops as represented by the solid line. As described above in relation to FIGS. 1 through 6, improper gate driving signals are prevented by adopting the (2−1)th, (3−1)th and (4−1)th transistors T2−1, T3−1 and T4−1.

Figure 9:
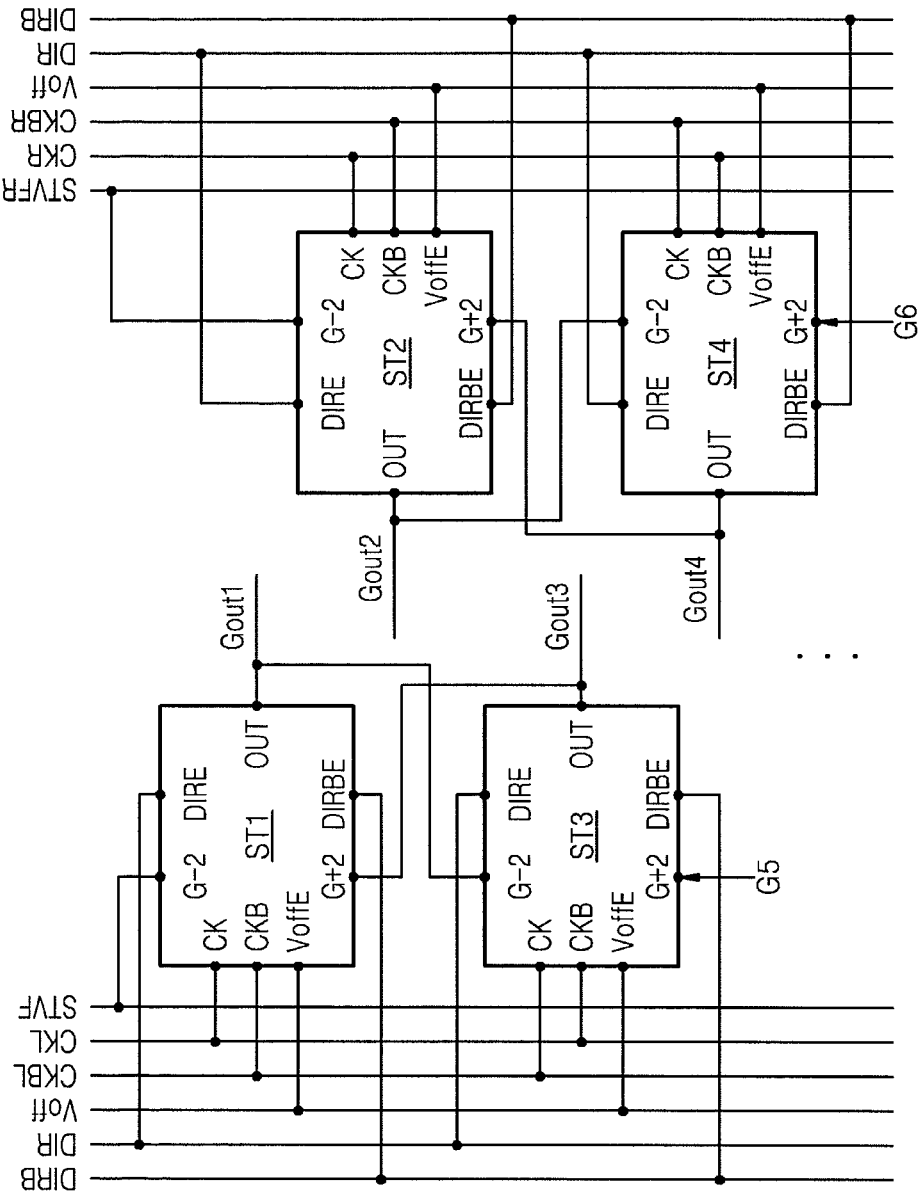
FIG. 9 is a schematic diagram of a gate driving circuit according to another embodiment.
Figure 10:
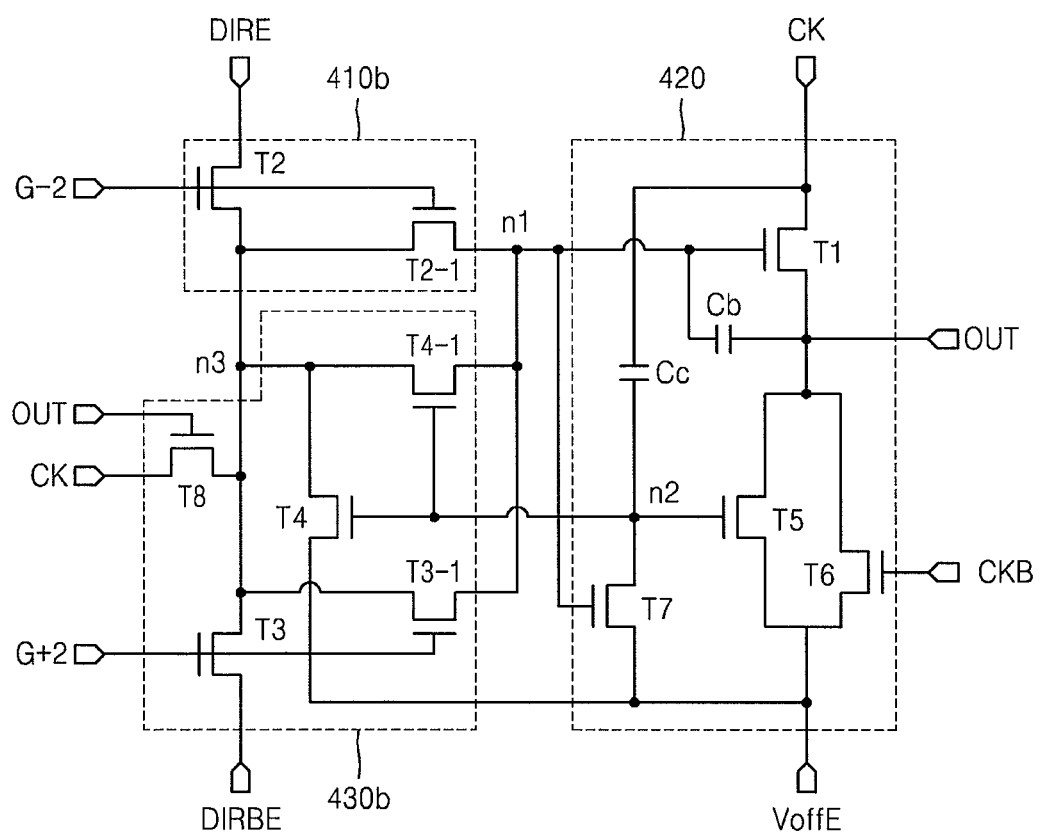
FIG. 10 is a circuit diagram of an arbitrary stage of the gate driving circuit illustrated in FIG. 9, according to an embodiment.

FIG. 9 is a schematic diagram of a gate driving circuit according to another embodiment. FIG. 10 is a circuit diagram of an arbitrary stage of the gate driving circuit illustrated in FIG. 9, according to an embodiment.

As illustrated in FIGS. 9 and 10, an eighth transistor T8 for maintaining a voltage of the third node n3 during a stage activation period may be further included. In FIGS. 1 through 5, the third node n3 is held in a high-Z state. However, in FIGS. 9 and 10, the clock terminal CK is connected to the third node n3. As illustrated in FIG. 10, the eighth transistor T8 includes a gate electrode connected to the output terminal OUT, a first electrode connected to the clock terminal CK, and a second electrode connected to the third node n3, so as to prevent the voltage of the third node n3 from dropping below a voltage level (ΔVCK−Vth_T2) while a gate on voltage Von is output to the output terminal OUT.

As illustrated in FIG. 9, each stage includes a first input terminal G−2, a first scan direction control signal terminal DIRE, a second scan direction control signal terminal DIRBE and a fourth input terminal G+2. The first and second scan direction control signal terminals DIRE and DIRBE correspond to the second and third input terminals G−1 and G+1, respectively. According to the circuits, the first through nth gate driving signals G1 through Gn are generated and output according to a scan direction set based on the first and second scan direction control signals DIR and DIRB. As illustrated in FIG. 10, each stage operates in response to the first and second scan direction control signals DIR and DIRB.

FIGS. 11 through 16 are graphs showing the effect of leakage from second, third and fourth transistors T2, T3 and T4 of FIG. 7. The first through nth output signals Gout1 through Gout using different channel widths W of second, third and fourth transistors T2, T3 and T4 are shown. For FIGS. 11 through 16, the first transistor T1 is set to have a channel width W of 2050 μm, fifth and sixth transistors T5 and T6 are set to have a channel width W of 540 μm, and the seventh transistor T7 is set to have a channel width W of 170 μm. Also, the first through seventh transistors T1 through T7 have a channel length of 4 μM. The coupling capacitor Cc has a capacitance of 1.5 pF and the boosting capacitor Cb has a capacitance of 2.5 pF. In FIGS. 11 through 16, the channel widths W of the second, third and fourth transistors T2, T3 and T4 are as represented in Table 1.

TABLE 1

Figure 11:
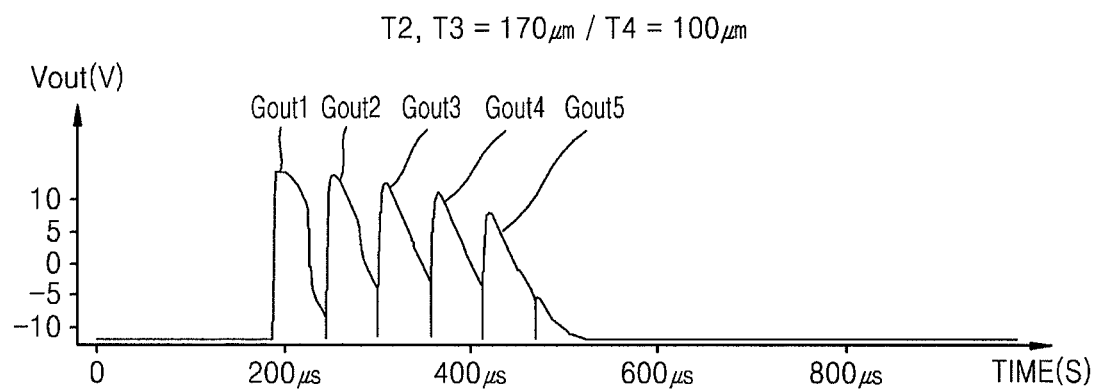
FIGS. 11 through 16 are graphs showing first through nth output signals of each channel, which are obtained by varying channel widths of the second, third and fourth transistors, according to comparative examples.
Figure 12:
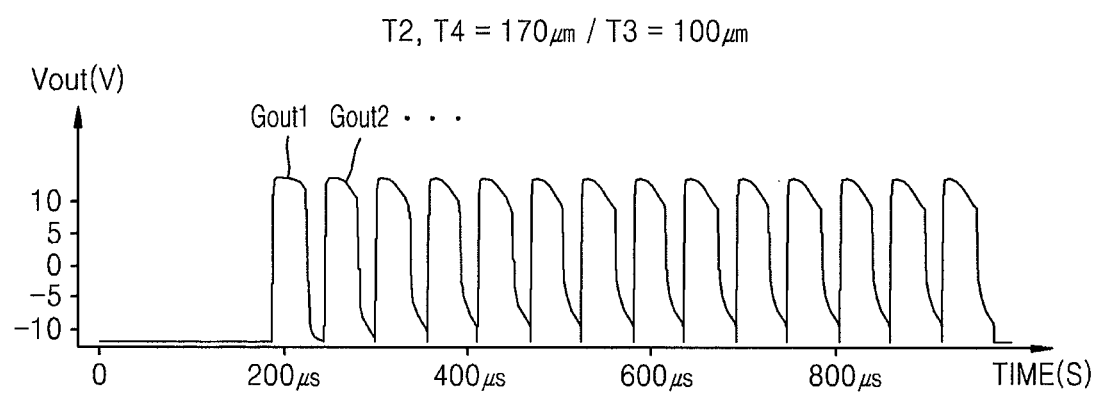
Figure 13:
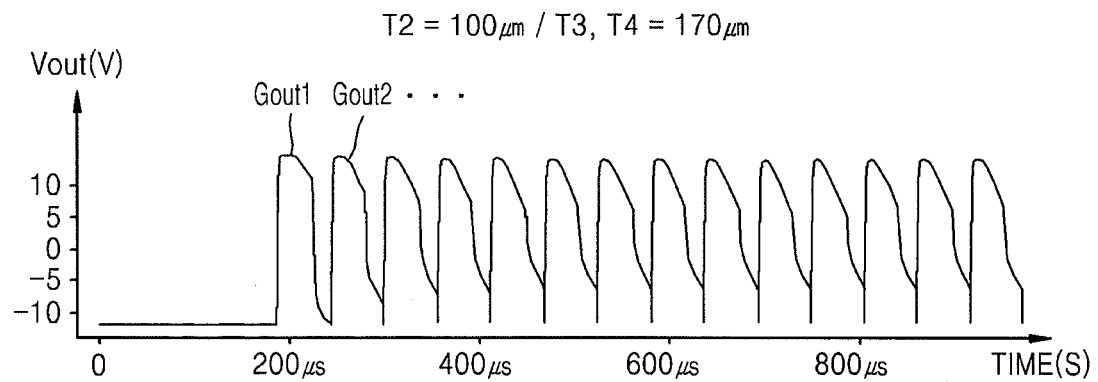

|  | T2 | T3 | T4 |
| --- | --- | --- | --- |
| FIG. 11 | 170 μm | 170 μm | 100 μm |
| FIG. 12 | 170 μm | 100 μm | 170 μm |
| FIG. 13 | 100 μm | 170 μm | 170 μm |

TABLE 1-continued

Figure 14:
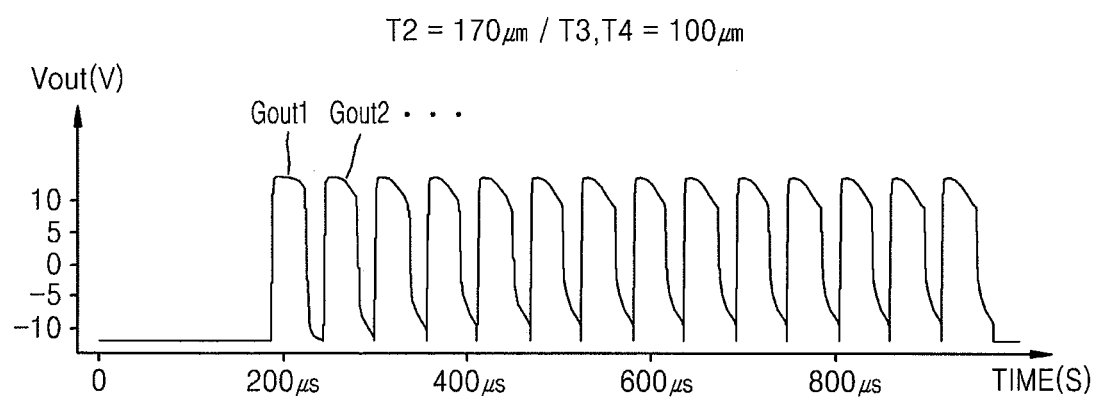
Figure 15:
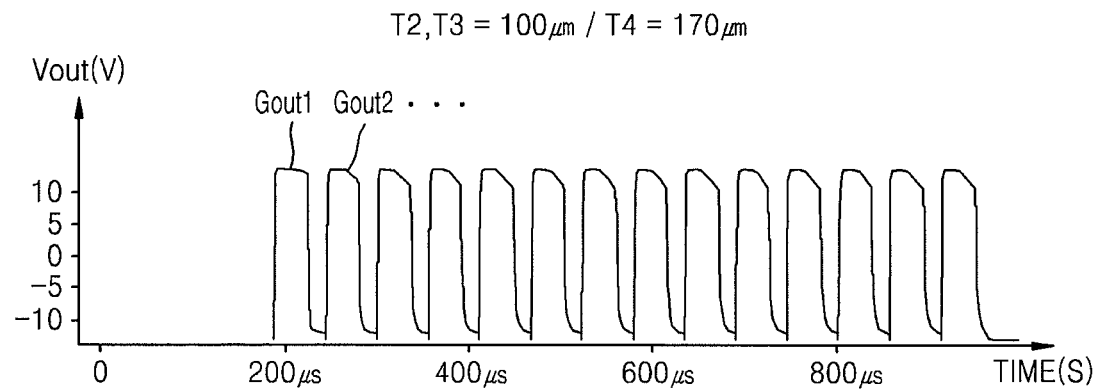
Figure 16:
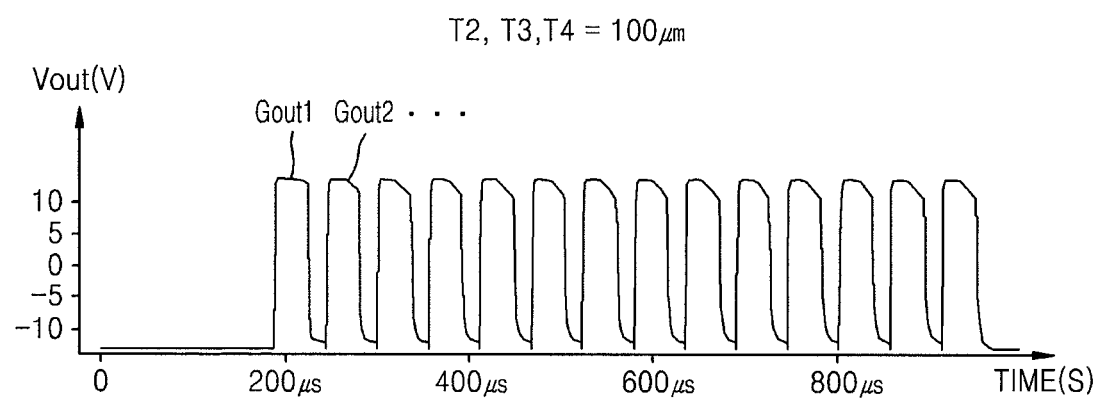

|  | T2 | T3 | T4 |
|---|---|---|---|
| FIG. 14 | 170 μm | 100 μm | 100 μm |
| FIG. 15 | 100 μm | 100 μm | 170 μm |
| FIG. 16 | 100 μm | 100 μm | 100 μm |

According to the test results of FIGS. 11 through 16, waveforms of the first through nth output signals Gout1 through Goutn are influenced by leakage current in an order of T3>T2>T4. As shown in FIG. 16, even when each of the second, third and fourth transistors T2, T3 and T4 have a channel width W of 100 μm, the waveforms of the first through nth output signals Gout1 through Goutn are distorted.

Figure 17A:
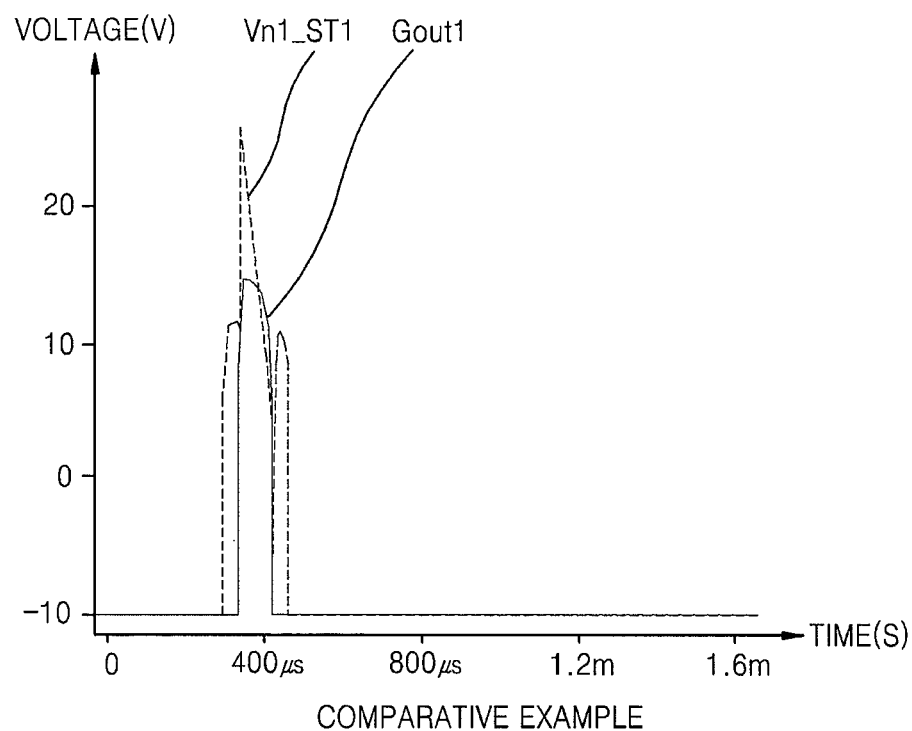
FIGS. 17A and 17B are graphs showing voltages of first nodes and first and fifteenth output signals of output terminals of first and fifteenth stages respectively in a gate driving circuit according to a comparative example, and in a gate driving circuit according to an embodiment.
Figure 17B:
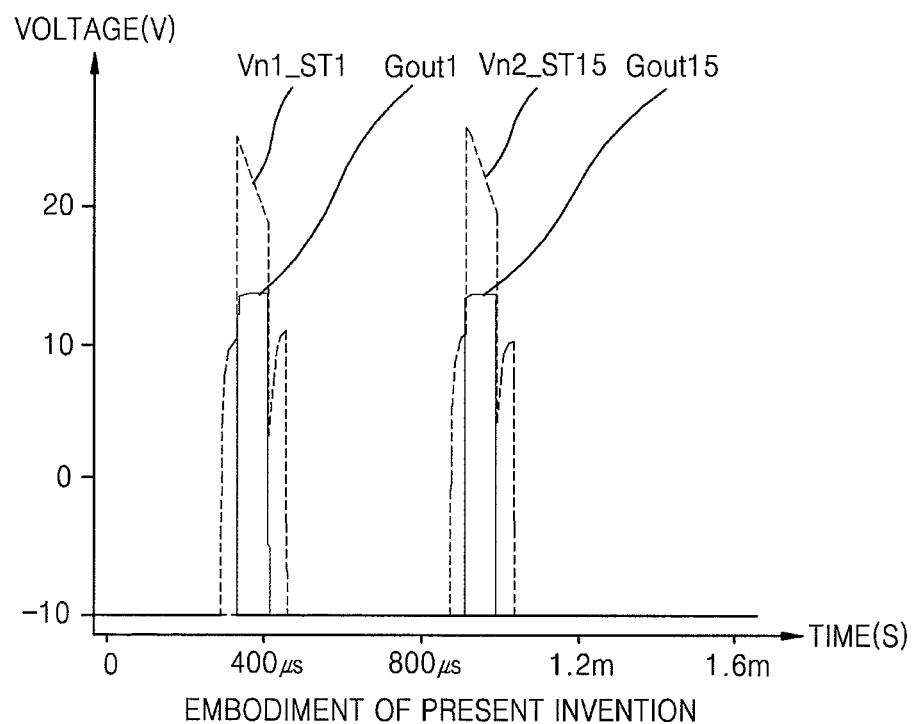

FIGS. 17A and 17B are graphs showing voltages Vn1_ST1 and Vn1_ST15 of first nodes n1 and first and fifteenth output signals Gout1 and Gout15 of output terminals OUT of first and fifteenth stages ST1 and ST15 in a gate driving circuit according to a gate driving circuit affected by leakage, and in a gate driving circuit according to an embodiment.

As shown in FIG. 17A, the voltage Vn1_ST1 of the first node n1 of the first stage ST1 is affected by leakage and a large voltage drop occurs. In addition, the first output signal Gout1 of the first stage ST1 is adversely affected by the leakage. Also, an output signal is not output in the fifteenth stage ST15. In contrast, in FIG. 17B according to an embodiment, the first and fifteenth output signals Gout1 and Gout15 are output as intended in both the first and fifteenth stages ST1 and ST15. Also shown is that the voltages Vn1_ST1 and Vn1_ST15 of the first nodes n1 of the first and fifteenth stages ST1 and ST15 are maintained above a certain voltage level during stage activation periods.

As described above, according to one or more of the described embodiments, improper gate driving signals may be greatly reduced by reducing leakage current when a node connected to a gate electrode of a driving transistor for driving an output signal of a gate driving circuit is intended to be in a high-Z state.

Also, characteristic dispersion of transistor characteristics that occurs due to fabrication process of a gate driving circuit formed on an a-Si TFT and characteristic variations according to an operation environment of the gate driving circuit may be greatly reduced.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A gate driving circuit for driving a display apparatus, the gate driving circuit comprising a plurality of stages, wherein each stage comprises:
   first, second, and third nodes, wherein the third node is directly electrically connected to one end of a current path across at least one transistor and wherein the first node is directly electrically connected to another end of the current path across the at least one transistor;
   an input circuit unit configured to transmit a driving voltage directly to the first node in response to an output signal of a previous stage or to a start pulse;
   a driving circuit unit comprising the second node and configured to generate an output signal according to a voltage of the first node; and
   a leakage preventing circuit unit configured to prevent a leakage current from the first node by maintaining the third node in a high impedance (high-Z) state when the first node is in a high-Z state,
   wherein the third node is configured to be maintained at a voltage level such that a gate to source voltage of the transistor has a negative value while the first node has a positive voltage.

2. The gate driving circuit of claim 1, wherein the driving circuit unit of each stage comprises a boosting capacitor connected to the first node and an output terminal for outputting an output signal, wherein the boosting capacitor boosts the voltage of the first node due to a voltage of the output terminal when the first node is in the high-Z state.

3. The gate driving circuit of claim 1, wherein each of the plurality of stages comprises a first input terminal connected to an output terminal of a stage immediately before a previous stage, and a second input terminal for receiving a first control signal, and wherein the input circuit unit comprises:
   a second transistor comprising a gate electrode connected to the first input terminal, a first electrode connected to the second input terminal, and a second electrode connected to the third node; and
   a (2−1)th transistor comprising a gate electrode connected to the first input terminal, a first electrode connected to the third node, and a second electrode connected to the first node.

4. The gate driving circuit of claim 3, wherein the first control signal is an output signal of the previous stage or a scan direction control signal.

5. The gate driving circuit of claim 1, wherein each of the plurality of stages comprises:
   a clock terminal, an inversion clock terminal, an output terminal for outputting the output signal, and an off voltage terminal for receiving a gate off voltage;
   a first transistor comprising a gate electrode connected to the first node, a first electrode connected to the clock terminal, and a second electrode connected to the output terminal;
   a fifth transistor comprising a gate electrode connected to the second node, a first electrode connected to the output terminal, and a second electrode connected to the off voltage terminal;
   a sixth transistor comprising a gate electrode connected to the inversion clock terminal, a first electrode connected to the output terminal, and a second electrode connected to the off voltage terminal;
   a seventh transistor comprising a gate electrode connected to the first node, a first electrode connected to the second node, and a second electrode connected to the off voltage terminal;
   a coupling capacitor connected between the clock terminal and the second node;
   a boosting capacitor connected between the first node and the output terminal.

6. The gate driving circuit of claim 5, wherein each of the plurality of stages comprises a third input terminal for receiving a second control signal and a fourth input terminal connected to an output terminal of a stage immediately after a subsequent stage, and
   wherein the leakage preventing circuit unit comprises:
   a third transistor comprising a gate electrode connected to the fourth input terminal, a first electrode connected to the third node, and a second electrode connected to the third input terminal;
   a (3−1)th transistor comprising a gate electrode connected to the fourth input terminal, a first electrode connected to the third node, and a second electrode connected to the first node;

a fourth transistor comprising a gate electrode connected to the second node, a first electrode connected to the third node, and a second electrode connected to the off voltage terminal; and a (4−1)th transistor comprising a gate electrode connected to the second node, a first electrode connected to the third node, and a second electrode connected to the first node.

7. The gate driving circuit of claim 6, wherein the second control signal is an output signal of the subsequent stage or an inversion scan direction control signal.

8. The gate driving circuit of claim 6, wherein each of the plurality of stages further comprises an eighth transistor comprising a gate electrode connected to the output terminal, a first electrode connected to the clock terminal, and a second electrode connected to the third node.

9. The gate driving circuit of claim 1, wherein the gate driving circuit is driven with first and second clock signals and first and second inversion clock signals, wherein each of (4a+1)th stages, where a is an integer, comprises a clock terminal for receiving the first clock signal, and an inversion clock terminal for receiving the first inversion clock signal, wherein each of (4a+2)th stages comprises a clock terminal for receiving the second clock signal, and an inversion clock terminal for receiving the second inversion clock signal, wherein each of (4a+3)th stages comprises a clock terminal for receiving the first inversion clock signal, and an inversion clock terminal for receiving the first clock signal, and wherein each of (4a+4)th stages comprises a clock terminal for receiving the second inversion clock signal, and an inversion clock terminal for receiving the second clock signal.

10. The gate driving circuit of claim 1, wherein the display apparatus is a liquid crystal display (LCD) apparatus, and the gate driving circuit is formed on an amorphous silicon (a-Si) thin film transistor (TFT).

11. A gate driving circuit for driving a display apparatus, the gate driving circuit comprising a plurality of stages, wherein each stage comprises:

first, second, and third nodes, wherein the third node is directly electrically connected to one end of a current path across at least one transistor and wherein the first node is directly electrically connected to another end of the current path across the at least one transistor;

an input circuit unit configured to transmit a driving voltage directly to the first node in response to an output signal of a previous stage or to a start pulse;

a driving circuit unit comprising the second node and configured to generate an output signal according to a voltage of the first node; and a leakage preventing circuit unit configured to prevent a leakage current from the first node by maintaining the third node in a high impedance (high-Z) state when the first node is in a high-Z state, wherein each of the plurality of stages comprises a third input terminal for receiving a second control signal and a fourth input terminal directly electrically connected to an output terminal of a stage immediately after a subsequent stage, and wherein the leakage preventing circuit unit comprises:

a third transistor comprising a gate electrode directly electrically connected to the fourth input terminal, a first electrode directly electrically connected to the third node, and a second electrode directly electrically connected to the third input terminal; and a (3−1)th transistor comprising a gate electrode directly electrically connected to the fourth input terminal, a first electrode directly electrically connected to the third node, and a second electrode directly electrically connected to the first node.

12. The gate driving circuit of claim 11, wherein the second control signal is an output signal of the subsequent stage or an inversion scan direction control signal.

13. The gate driving circuit of claim 11, wherein each of the plurality of stages further comprises an eighth transistor comprising a gate electrode connected to the output terminal, a first electrode connected to the clock terminal, and a second electrode connected to the third node.

14. A display apparatus comprising:

a plurality of pixels disposed near intersections of data lines and gate lines;

a gate driving unit for outputting gate driving signals to the plurality of pixels via the gate lines; and a data driving unit for generating a data signal corresponding to an input image and outputting the data signal to the plurality of pixels via the data lines, wherein the gate driving unit comprises a plurality of stages, wherein each stage comprises:

first, second, and third nodes, wherein the third node is directly electrically connected to one end of a current path across at least one transistor and wherein the first node is directly electrically connected to another end of the current path across the at least one transistor;

an input circuit unit configured to transmit a driving voltage directly to the first node in response to an output signal of a previous stage or to a start pulse;

a driving circuit unit comprising the second node and configured to generate an output signal according to a voltage of the first node; and a leakage preventing circuit unit configured to prevent a leakage current from the first node by maintaining the third node in a high impedance (high-Z) state when the first node is in a high-Z state, wherein the third node is configured to be maintained at a voltage level such that a gate to source voltage of the transistor has a negative value while the first node has a positive voltage.

15. The display apparatus claim 14, wherein the driving circuit unit of each stage comprises a boosting capacitor connected to the first node and an output terminal for outputting an output signal, wherein the boosting capacitor boosts the voltage of the first node due to a voltage of the output terminal when the first node is in the high-Z state.

16. The display apparatus claim 14, wherein each of the plurality of stages comprises a first input terminal connected to an output terminal of a stage immediately before a previous stage, and a second input terminal for receiving a first control signal, and wherein the input circuit unit comprises:

a second transistor comprising a gate electrode connected to the first input terminal, a first electrode connected to the second input terminal, and a second electrode connected to the third node; and a (2−1)th transistor comprising a gate electrode connected to the first input terminal, a first electrode connected to the third node, and a second electrode connected to the first node.

17. The display apparatus claim 14, wherein each of the plurality of stages comprises:

a clock terminal, an inversion clock terminal, an output terminal for outputting the output signal, and an off voltage terminal for receiving a gate off voltage;

a first transistor comprising a gate electrode connected to the first node, a first electrode connected to the clock terminal, and a second electrode connected to the output terminal;

a fifth transistor comprising a gate electrode connected to the second node, a first electrode connected to the output terminal, and a second electrode connected to the off voltage terminal;

a sixth transistor comprising a gate electrode connected to the inversion clock terminal, a first electrode connected to the output terminal, and a second electrode connected to the off voltage terminal;

a seventh transistor comprising a gate electrode connected to the first node, a first electrode connected to the second node, and a second electrode connected to the off voltage terminal;

a coupling capacitor connected between the clock terminal and the second node; and a boosting capacitor connected between the first node and the output terminal.

18. The display apparatus claim 14, wherein each of the plurality of stages comprises a third input terminal for receiving a second control signal and a fourth input terminal connected to an output terminal of a stage immediately after a subsequent stage, and wherein the leakage preventing circuit unit comprises:

a third transistor comprising a gate electrode connected to the fourth input terminal, a first electrode connected to the third node, and a second electrode connected to the third input terminal; and a (3−1)th transistor comprising a gate electrode connected to the fourth input terminal, a first electrode connected to the third node, and a second electrode connected to the first node.

19. The display apparatus claim 14, wherein the gate driving circuit is driven with first and second clock signals and first and second inversion clock signals, wherein each of (4a+1)th stages, where a is an integer, comprises a clock terminal for receiving the first clock signal, and an inversion clock terminal for receiving the first inversion clock signal, wherein each of (4a+2)th stages comprises a clock terminal for receiving the second clock signal, and an inversion clock terminal for receiving the second inversion clock signal, wherein each of (4a+3)th stages comprises a clock terminal for receiving the first inversion clock signal, and an inversion clock terminal for receiving the first clock signal, and wherein each of (4a+4)th stages comprises a clock terminal for receiving the second inversion clock signal, and an inversion clock terminal for receiving the second clock signal.

20. The display apparatus claim 14, wherein the display apparatus is a liquid crystal display (LCD) apparatus, and the gate driving circuit is formed on an amorphous silicon (a-Si) thin film transistor (TFT).

* * * * *